United States Patent
Nakayama

(10) Patent No.: US 6,947,461 B2
(45) Date of Patent: Sep. 20, 2005

(54) SEMICONDUCTOR LASER DEVICE

(75) Inventor: Takeshi Nakayama, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 108 days.

(21) Appl. No.: 10/373,868

(22) Filed: Feb. 27, 2003

(65) Prior Publication Data
US 2004/0052282 A1 Mar. 18, 2004

(30) Foreign Application Priority Data
Sep. 17, 2002 (JP) .................................... 2002-270174

(51) Int. Cl.$^7$ ................................................ H01S 5/00
(52) U.S. Cl. ........................... 372/44; 372/45; 372/46
(58) Field of Search ..................................... 372/44–46

(56) References Cited

U.S. PATENT DOCUMENTS

| 5,355,384 A | * | 10/1994 | Inoue et al. ................. 372/46 |
| 5,608,752 A | * | 3/1997 | Goto et al. .................. 372/46 |
| 6,333,945 B1 | | 12/2001 | Abe et al. |
| 6,606,334 B1 | * | 8/2003 | Shigihara et al. ............ 372/45 |
| 2003/0031220 A1 | * | 2/2003 | Takeuchi et al. ............. 372/45 |

FOREIGN PATENT DOCUMENTS

| JP | 8-195529 | 7/1996 |
| JP | 11-243259 | 9/1999 |

* cited by examiner

Primary Examiner—Minsun Oh Harvey
Assistant Examiner—James Menefee
(74) Attorney, Agent, or Firm—Leydig, Voit & Mayer, Ltd.

(57) ABSTRACT

A semiconductor laser device includes a p-InP cladding layer, an active region, a first n-InP cladding layer, a second n-InP cladding layer, and an n-InGaAsP cladding layer with a thickness between 0.05 μm and 0.3 μm, sandwiched by the first and second n-laP cladding layers and laminated at a position closer to the active region than a position at which optical intensity of a near-field pattern of laser light emitted from the active region becomes substantially zero. The semiconductor laser device exhibits a small reduction in the optical output even when a large current flows, and has a high slope efficiency without changing the near-field pattern a great deal.

9 Claims, 6 Drawing Sheets

SEMICONDUCTOR LASER DEVICE

BACKGROUND OF THE INVENTION

1. Field of the Invention

The present invention relates to a semiconductor laser device used for optical communications and, more particularly, to a semiconductor laser device having an asymmetrical optical intensity distribution.

2. Description of the Related Art

With the spread of public networks using optical fibers, there is an increasing need to transmit a large amount of information at low cost. To meet such a need, the public networks must be improved at low cost to increase the amount of information that can be transmitted. This requires the development of a semiconductor laser device which has good optical matching to the existing optical fiber networks and high optical output efficiency.

FIG. 15 is a cross-sectional view of a conventional semiconductor laser.

In the figure, reference numeral 200 denotes a semiconductor laser; 202 a p conductivity type InP substrate ("p conductivity type" and "n conductivity type" are hereinafter expressed as "p-" and "n-", respectively); 204 a p-InP cladding layer; and 206 an active region. The active region 206 comprises: an active layer having a multiple quantum well structure made of InGaAsP well layers and InGaAsP barrier layers; and light confining InGaAsP layers disposed over and under the active layer, sandwiching the active layer. Reference numeral 208 denotes an n-InP cladding layer; 210 an InP current blocking layer; 212 an n-InP contact layer; 214 an n type electrode; and 216 a p type electrode.

In the semiconductor laser 200, if a bias voltage is applied between the p type electrode 216 and the n type electrode 214 such that the p type electrode 216 is at a positive potential, a current effectively flows through only the active region 206, making it possible for the semiconductor laser 200 to operate with low current and emit light. Since the refractive index of the InP cladding layers 204 and 208 are smaller than that of the active region 206, the light is distributed mainly in and around the active region 206.

FIG. 16 is a schematic diagram showing a near-field pattern of a conventional semiconductor laser. In the figure, the vertical axis indicates the intensity of the light, while the horizontal axis indicates the distance from the active region 206. The broken line parallel to the horizontal axis indicates 10% of the peak value of the optical intensity.

In FIG. 16, the optical intensity distribution is symmetrical about the active region 206 at the center (the optical intensity distribution on the n side is identical to that on the p side). In the example shown in FIG. 16, the areas defined by the optical intensity distribution curves on the n side and on the p side are each 0.397. The optical intensity distribution curve approaches the horizontal axis as the distance from the active region 206 increases. The optical intensity becomes substantially zero at positions approximately 2.0 μm away from the active region 206 at the center.

Two prior art techniques for semiconductor lasers are described as follows.

One was devised for high-power double heterostructure semiconductor lasers in which an active layer having a multiple quantum well structure is sandwiched by an n-AlGaAs optical guide layer and a p-AlGaAs optical guide layer which, in turn, are sandwiched by an n-AlGaAs cladding layer and a p-AlGaAs cladding layer. These layers have different material composition ratios. With this arrangement, the total refraction distribution is shifted toward one or the other side of the active layer such that the peak of the optical density distribution does not coincide with that of the electric current, thereby preventing degradation of the materials and enhancing the reliability (for example, see Japanese Patent Laid-Open No. Hei 11 (1999)-243259, pp. 6–9, FIGS. 1–3).

The other technique was developed for semiconductor lasers used as an excitation light source for optical fiber amplifiers, etc. In semiconductor lasers using this technique, an active layer is sandwiched by upper and lower guide layers which, in turn, are sandwiched by upper and lower cladding layers.

Furthermore, semiconductor layers having a refractive index lower than that of the cladding layers are each inserted between the upper guide layer and the upper cladding layer or between the lower guide layer and the lower cladding layer, thereby realizing a semiconductor laser having a narrow vertical radiation angle (20° C. or less) and a stable transverse mode (for example, see Japanese Patent Laid-Open No. Hei 8(1996)-195529, pp. 3–4, FIG. 3).

When the semiconductor laser 200 is emitting light, a large amount of light leaks into the p-InP cladding layer 204 and the n-InP cladding layer 208 since the active region 206 is a thin layer. Generally, to obtain a high ratio of light output to electric current (that is, slope efficiency) of a semiconductor laser, it is necessary to reduce the amount of light absorbed in the areas outside the active region 206, especially in the p-InP cladding layer 204.

A major factor contributing to light absorption in the p type semiconductor area is that there is noticeable intervalence band absorption in the p type impurity-injected region. This phenomenon occurs with not only InP type materials but also AlGaAs type materials. However, the phenomenon is noticeably observed in the case of the InP type materials.

To control this phenomenon, conventional methods reduce the carrier concentration of the p type semiconductor area, for example, that of the p-InP cladding layer 204. However, the electric resistance of the p type semiconductor area generally tends to be higher than that of the n type semiconductor area, and reducing the carrier concentration of the p type semiconductor area further increases its electric resistance, entailing the problem of a reduction in the optical output due to heat produced when a large current flows, that is, the problem of roll-off.

Furthermore, since optical fiber networks have already begun to spread, semiconductor lasers must have not only high slope efficiency but also sufficient optical matching to the existing optical fiber networks. Therefore, the semiconductor lasers must have a near-field pattern which is not much different than that of conventional semiconductor lasers.

SUMMARY OF THE INVENTION

The present invention has been devised to solve the above problems. It is, therefore, a primary object of the present invention to provide a semiconductor laser which exhibits only a small reduction in the optical output even when a large current flows and which has high slope efficiency and a near-field pattern not much different than that of conventional semiconductor lasers.

According to one aspect of the invention, there is provided a semiconductor laser device comprising: a semiconductor substrate of a first conductive type; a first cladding layer of a first conductive type disposed on the semiconductor substrate; an active layer disposed on the first cladding layer; a second cladding layer of a second conductive type disposed on the active layer; and a semiconductor layer with a thickness of between 0.05 μm and 0.3 μm laminated at a position closer to the active layer than a position at which an optical intensity of a near-field pattern of laser light emitted from the active layer becomes substantially zero, the semiconductor layer shifting a weighted center of an optical intensity distribution toward an n conductive type side.

Therefore, light leakage is shifted toward a cladding layer side of the n-conductive type without changing the near-field pattern a great deal, resulting in reduced light absorption in the cladding-layer of the p-conductive type and enhanced slope efficiency.

Accordingly, it is possible to provide a semiconductor laser which has high optical output efficiency and exhibits only a small reduction in the optical output even when a large current flows and whose matching to optical fibers is not much different than that of conventional semiconductor lasers.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

The following description explains preferred embodiments of the present invention using, for example, InP embedded type semiconductor lasers for the wavelength band from 1.3 μm to 1.7 μm used for optical communications.

First Embodiment

Figure 1:
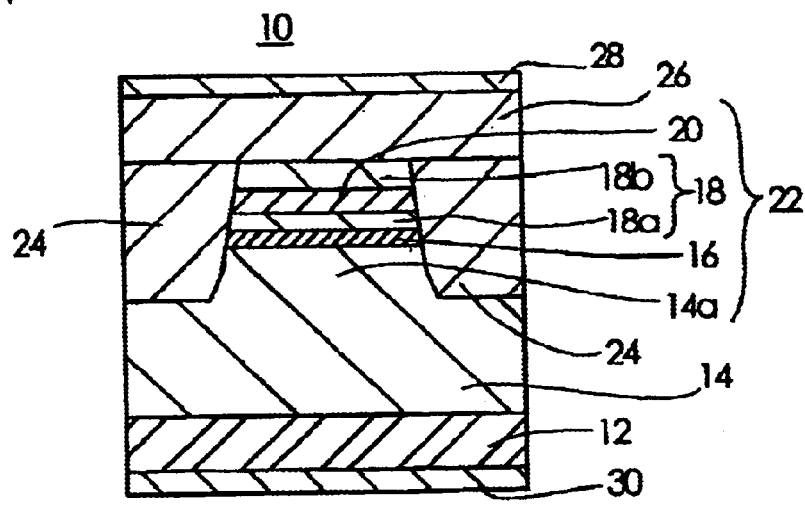
FIG. 1 is a cross-sectional view of a semiconductor laser according to an embodiment of the present invention.

FIG. 1 is a cross-sectional view of a semiconductor laser according to a first embodiment of the present invention.

In the figure, reference numeral 10 denotes a semiconductor laser. In FIG. 1, the optical waveguide direction of the semiconductor laser 10 is perpendicular to the paper. Reference numeral 12 denotes a p-InP substrate used as the semiconductor substrate, and 14 denotes a p-InP cladding layer which is a first cladding layer disposed on the p-InP substrate 12. The p-InP cladding layer 14 has a bandgap energy of 1.35 eV, a layer thickness of 1,000 nm, and a carrier concentration of $1 \times 10^{18}$ cm$^{-1}$. Reference numeral 16 denotes an active region disposed on the p-InP cladding layer 14.

Reference numeral 18 denotes an n-InP cladding layer which is a second cladding layer disposed on the active region 16. According to the present embodiment, the n-InP cladding layer 18 comprises two layers: an n-InP cladding layer 18a adjacent the active region 16; and an n-InP cladding layer 18b disposed on the n-InP cladding layer 18a. The n-InP cladding layer 18 has a bandgap energy of 1.35 eV and a carrier concentration of $1 \times 10^{18}$ cm$^{-1}$, and the layer thickness of the n-InP cladding layer 18a is, for example, 700 nm.

Reference numeral 20 denotes an n-InGaAsP cladding layer which is a semiconductor layer inserted between the n-InP cladding layers 18a and 18b. The n-InGaAsP cladding layer 20 is made of the material $In_{0.8}Ga_{0.2}As_{0.44}P_{0.56}$, and has a bandgap energy of 1.03 eV, a layer thickness of 100 nm, and a carrier concentration of $1 \times 10^{18}$ cm$^{-1}$.

A portion 14a of the p-InP cladding layer 14, the active region 16, the n-InP cladding layer 18a, the n-InGaAsP cladding layer 20, and the n-InP cladding layer 18b are formed in a ridge shape, collectively forming an optical waveguide ridge 22.

An InP layer 24 is disposed on each side of the optical waveguide ridge 22, and functions as a current blocking layer. Reference numeral 26 denotes an n-InP contact layer disposed on the n-InP cladding layer 18b and the InP layer 24. Reference numeral 28 denotes an n type electrode disposed on the n-InP contact layer 26, while 30 denotes a p type electrode disposed on the rear surface of the p-InP substrate 12.

Figure 2:
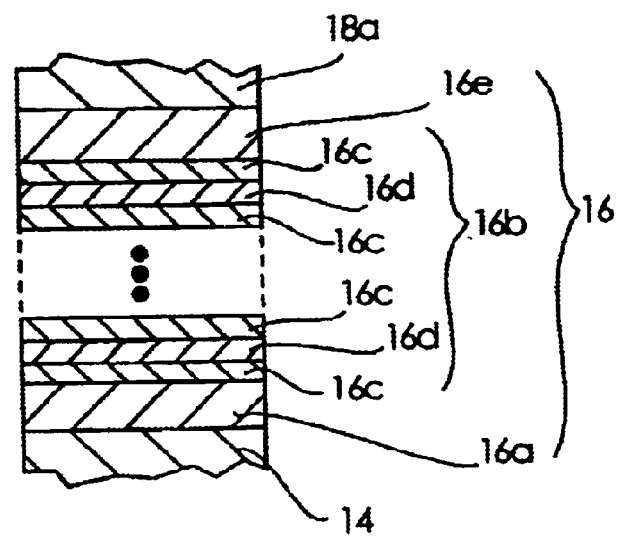
FIG. 2 is a schematic diagram showing the active region of the semiconductor laser according to an embodiment of the present invention.

FIG. 2 is a schematic diagram showing the active region of the semiconductor laser according to the first embodiment of the present invention. Specifically, FIG. 2 is a cross-sectional view of the active region.

In the figure, reference numeral 16a denotes a light confining InGaAsP layer which is a first light confining layer adjacent the p-InP cladding layer 14. The light confining InGaAsP layer is made of the material undoped $In_{0.8}Ga_{0.2}As_{0.44}P_{0.56}$ and has a bandgap energy of 1.03 eV and a layer thickness of 40 nm.

Reference numeral 16b denotes an active layer disposed on the light confining InGaAsP layer 16a. The active layer 16b has a multiple quantum well structure in which a well layer 16c and a barrier layer 16d are alternately disposed. The well layer 16c is made of undoped $In_{0.8}Ga_{0.2}As_{0.74}P_{0.26}$ and has a bandgap energy of 0.77 eV and a layer thickness of 6.5 nm, while the barrier layer 16d is made of undoped $In_{0.71}Ga_{0.29}As_{0.48}P_{0.52}$ and has a bandgap energy of 1.03 eV and a layer thickness of 9 nm.

Reference numeral 16e denotes a light confining InGaAsP layer which is a second light confining layer disposed on the active layer 16b. The light confining InGaAsP layer 16e is made of the material undoped $In_{0.8}Ga_{0.2}As_{0.44}P_{0.56}$ and has a bandgap energy of 1.03 eV and a layer thickness of 40 nm.

According to the first embodiment, the active region 16 comprises the light confining InGaAsP layer 16a, the active layer 16b, and the light confining InGaAsP layer 16e.

It should be noted that the p type semiconductor layers are added with an impurity such as Zn whereas the n type semiconductor layers are added with an impurity such as S.

Figure 3:
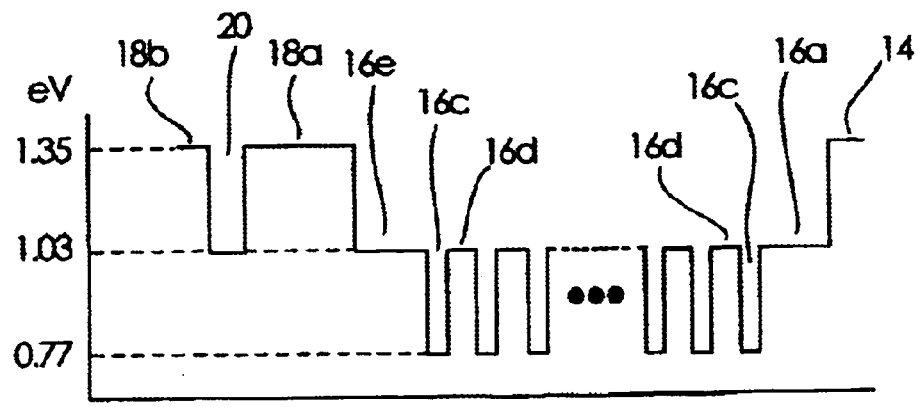
FIG. 3 is an energy band diagram showing the energy band structure of the semiconductor laser according to an embodiment of the present invention.

FIG. 3 is an energy band diagram showing the energy band structure of the semiconductor laser according to the first embodiment of the present invention.

According to the first embodiment, the n-InGaAsP cladding layer 20 has a bandgap energy of 1.03 eV, which is the same as those of the light confining InGaAsP layer 16a, the barrier layer 16d, and the light confining InGaAsP layer 16e. However, the bandgap energy of the n-InGaAsP cladding layer 20 may not necessarily be equal to them.

Figure 4:
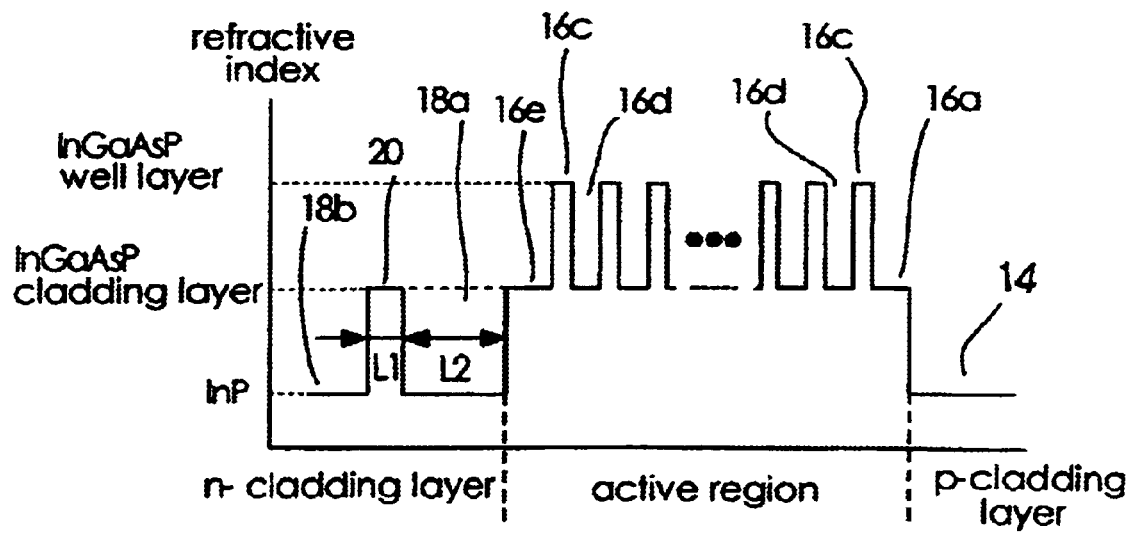
FIG. 4 is a schematic diagram showing refractive indices of the semiconductor laser according to an embodiment of the present invention.

FIG. 4 is a schematic diagram showing refractive indices of the semiconductor laser according to the first embodiment of the present invention.

In the figure, the InP cladding layers 18 and 14 have the smallest refractive index, while the well layer 16c made of $In_{0.8}Ga_{0.2}As_{0.74}P_{0.26}$ has the largest refractive index. Furthermore, according to the first embodiment, the refractive index of the n-InGaAsP cladding layer 20 is equal to those of the light confining InGaAsP layer 16a, the barrier layer 16d, and the light confining InGaAsP layer 16e. However, the refractive index of the n-InGaAsP cladding layer 20 may not necessarily be equal to them if it is larger than the refractive index of the n-InP cladding layer 18 and smaller than that of the well layer 16c.

Further according to the first embodiment, the distance L2 between the active region 16 and the n-InGaAsP cladding layer 20 is set equal to the layer thickness L2 of the n-InP cladding layer 18, for example, 700 nm, while the layer thickness L1 of the n-InGaAsP cladding layer 20 is set to 100 nm.

Figure 5:
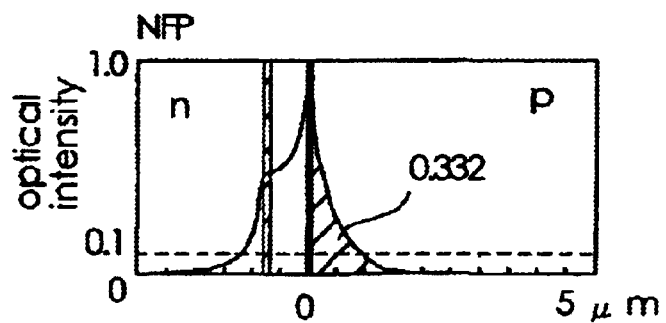
FIG. 5 is a schematic diagram showing a near-field pattern of the semiconductor laser according to an embodiment of the present invention.

FIG. 5 is a schematic diagram showing a near-field pattern of the semiconductor laser according to the first embodiment of the present invention. In the figure, the vertical axis indicates the optical intensity, while the horizontal axis indicates the distance from the active region 16. The broken line parallel to the horizontal axis indicates 10% of the peak value of the optical intensity.

In FIG. 5, the light intensity is distributed in and around the active region 16 indicated by the thick black vertical line at the center. In the semiconductor laser 10, however, since the n-InGaAsP cladding layer 20 is disposed such that it is sandwiched by the n-InP cladding layers 18a and 18b, the distribution of the light is not symmetrical about the active region 16. Specifically, in the area close to the active region 16 on the n side, the optical intensity decreases at a almost constant rate as the distance from the active region 16 at the center increases. Then, the n-InGaAsP cladding layer 20 (indicated by the shaded portion on the n side) elevates the optical intensity curve. This makes the distribution of the optical intensity asymmetrical and increases the area defined by the optical intensity curve on the n side.

In FIG. 5, the optical intensity curve decreases and thereby approaches the horizontal axis as the distance from the active region 16 increases. The optical intensity becomes substantially zero at a distance of approximately between 1.5 μm and 2.0 μm from the active region 16 on the p side. On the n side, even though the optical intensity does not decrease at a constant rate since the n-InGaAsP cladding layer 20 is inserted, it becomes substantially zero at a distance of approximately 3 μm from the active region 16.

Thus, the n-InGaAsP cladding layer 20 is inserted into the n-InP cladding layer 18 to shift the weighted center of the optical intensity distribution toward the n side. To ensure a sufficient amount of shift, however, it is necessary to set the position of the n-InGaAsP cladding layer 20 closer to the active layer than the position at which the optical intensity of the near-field pattern of the laser light becomes substantially zero. Preferably, the n-InGaAsP cladding layer 20 may be set at a position closer to the active layer than the position at which the optical intensity is reduced to 10% of the peak value. According to the first embodiment, since the optical intensity of the near-field pattern becomes substantially zero at a distance of approximately between 1.5 μm (1,500 nm) and 2.0 μm from the active region 16, the sum of L1 and L2 is set to 1.5 μm or less, preferably between 0.7 and 0.9 μm.

On the other hand, the layer thickness L1 of the n-InGaAsP cladding layer 20 is set to between 0.05 μm and 0.3 μm, preferably between 0.05 μm and 0.2 μm (more preferably to around 0.1 μm).

The method for manufacturing the semiconductor laser 10 will be briefly described below.

On the p-InP substrate 12 and by use of the MOCVD method, the manufacturing method sequentially forms: the p-InP cladding layer 14; the light confining InGaAsP layer 16a; the active layer 16b having a multiple quantum well structure in which the well layer 16c of $In_{0.8}Ga_{0.2}As_{0.74}P_{0.26}$ and the barrier layer 16d of $In_{0.71}Ga_{0.29}As_{0.48}P_{0.52}$ are alternately disposed; the n-InP cladding layer 18a; the n-InGaAsP cladding layer 20; and the n-InP cladding layer 18b.

Then, the optical waveguide ridge 22 having a width of approximately between 1 μm and 2 μm and extending in the optical waveguide direction is formed by use of an ordinary photolithographic method and a chemical etching method.

After that, the InP layer 24 is grown such that it fills in the portions around the optical waveguide ridge 22 by use of the MOCVD method, etc, forming a current blocking structure.

Then, the surfaces of the optical waveguide ridge 22 and the InP layer 24 are flattened by etching before the n-InP contact layer 26 is crystal-grown.

In addition, the n type electrode 28 is formed on the upper surface of the n-InP contact layer 26, and the p type electrode 30 is formed on the rear surface of the p-InP substrate 12, completing formation of the semiconductor laser 10.

The operation will be described below.

In the semiconductor laser 10, if a bias voltage is applied between the p type electrode 30 and the n type electrode 28 such that the p type electrode 30 is at a positive potential, a current flows through the optical waveguide ridge 22 since the InP layer 24 has a current blocking structure. Most current effectively flows through the active region 16 in the optical waveguide ridge 22, making it possible to the semiconductor laser 10 to operate with low current and emit light. Since the refractive indices of the p-InP cladding layer 14 and the n-InP cladding layer 18 are smaller than that of the active region 16, the light is distributed mainly in and around the active region 16.

Since the n-InGaAsP cladding layer 20 is sandwiched by the n-InP cladding layers 18a and 18b included in the n-InP cladding layer 18 of the semiconductor laser 10, the distribution of the light is not symmetrical about the active region 16 (the optical intensity on the n side is not identical to that on the p side). Specifically, in the area close to the active region 16 on the n side, the optical intensity decreases at a almost constant rate as the distance from the active region 16 increases. Then, the n-InGaAs cladding layer 20 (indicated by the shaded portion on the n side) elevates the optical intensity curve. This makes the distribution of the optical intensity asymmetrical and increases the area defined by the optical intensity curve on the n side.

Figure 16:
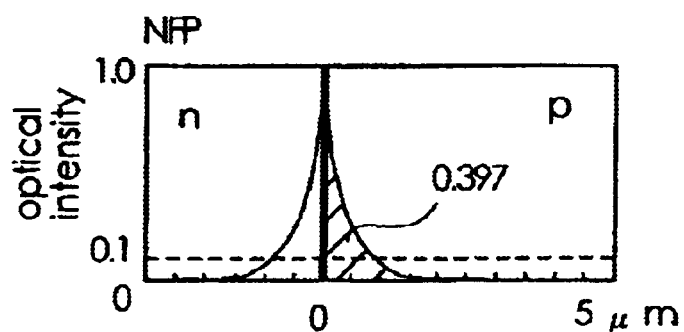
FIG. 16 is a schematic diagram showing a near-field pattern of a conventional semiconductor laser.

In the conventional semiconductor laser shown in FIG. 16, the distribution of the optical intensity on the n side is identical to that on the p side, and the proportion of the area defined by the optical intensity curve on each side is 0.397. In the semiconductor laser 10 shown in FIG. 5, on the other hand, the proportion of the area defined by the light distribution curve is reduced to 0.332 on the p side, which increases the proportion of the area defined by the optical intensity distribution curve on the n side by an equal amount.

This is because the n-InGaAsP cladding layer 20 having a refractive index larger than that of InP and smaller than that of the well layer 16c is inserted between the n-InP cladding layers 18a and 18b, thereby making the average value of the refractive indices of the cladding layers on the n side larger than that for the cladding layers on the p side. This shifts the weighted center of the optical intensity distribution toward the cladding layers on the n side and also shifts the light leakage toward the n side, resulting in reduced light leakage and light absorption on the p side.

Furthermore, since the light leakage is shifted toward the n side, it is not necessary to reduce the impurity concentration on the p side, resulting in no increase in the electric resistance due to reduced impurity concentration. Therefore, roll-off of the optical output due to heat generation does not occur, making it possible to reduce the absorption of light and thereby increase the optical output and the slope efficiency.

Figure 6:
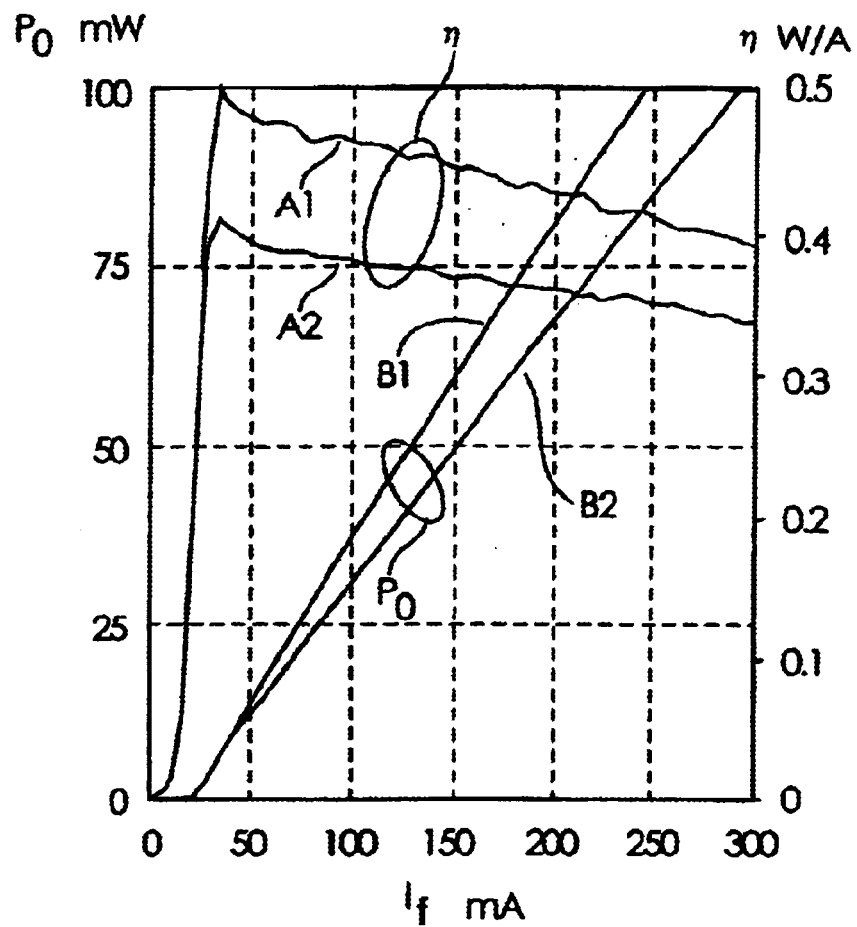
FIG. 6 is a graph showing the optical output and the slope efficiency of the semiconductor laser according to an embodiment of the present invention.

FIG. 6 is a graph showing the optical output and the slope efficiency of the semiconductor laser according to the first embodiment of the present invention. FIG. 6 also shows the optical output and the slope efficiency of a semiconductor laser having a conventional structure for comparison.

In the figure, curves A1 and A2 each indicate the relationship between current If and slope efficiency η and are obtained using the semiconductor laser 10 and the conventional semiconductor laser, respectively.

On the other hand, curves B1 and B2 each indicate the relationship between current If and laser output P0 and are also obtained using the semiconductor laser 10 and the conventional semiconductor laser, respectively.

As shown in FIG. 6, the optical output and the slope efficiency of the semiconductor laser 10 are larger or higher than those of the conventional semiconductor laser.

Further according to the first embodiment, since the layer thickness of the n-InGaAsP cladding layer 20 is as thin as 100 nm and furthermore a sufficient interval of 700 nm is provided between the n-InGaAsP cladding layer 20 and the active region 16, the near-field pattern is not changed a great deal. This makes it possible to ensure optical matching of the semiconductor laser with optical fibers which is equivalent to that of conventional semiconductor lasers, providing good matching to the existing optical fiber networks.

Figure 7:
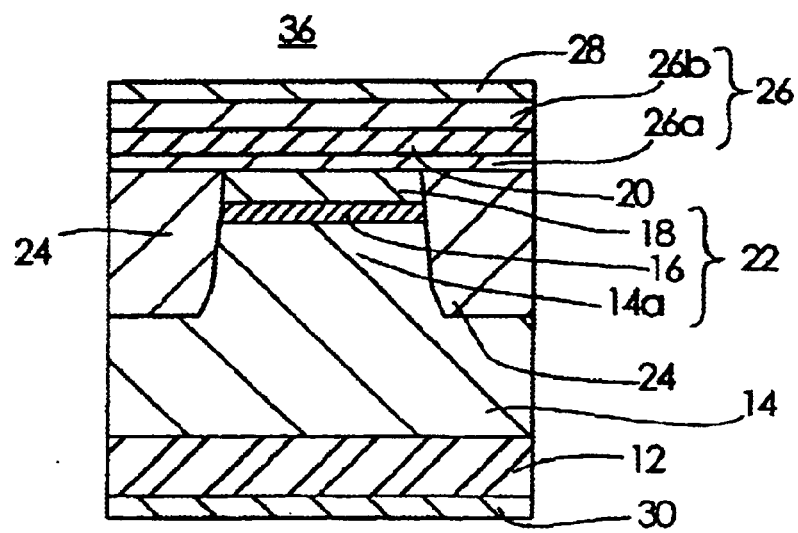
FIG. 7 is a cross-sectional view of a variation of the semiconductor laser according to an embodiment of the present invention.

FIG. 7 is a cross-sectional view of a variation of the semiconductor laser according to the first embodiment of the present invention.

In the figure, reference numeral 36 denotes a semiconductor laser. The components in this figure which are the same as or correspond to those in FIG. 1 are denoted by like numerals. This rule is also applied to the subsequent figures.

In the semiconductor laser 36, the n-InP cladding layer 18 is relatively thin. In such a case, the n-InP contact layer 26 may be divided into two layers: an n-InP contact layer 26a and an n-InP contact layer 26b. Then, the n-InGaAsP cladding layer 20 may be disposed between them.

Also in this case, it is necessary to set the position of the n-InGaAsP cladding layer 20 closer to the active layer than the position at which the optical intensity of the near-field pattern of the laser light becomes substantially zero. Preferably, the n-InGaAsP cladding layer 20 may be set at a position closer to the active layer than the position at which the optical intensity is reduced to 10% of the peak value.

According to this variation of the first embodiment, since the optical intensity of the near-field pattern becomes substantially zero at a distance of approximately between 1.5 μm (1,500 nm) and 2.0 μm from the active region 16, the sum of L1 and L2 is set to 1.5 μm or less, preferably between 0.7 and 0.9 μm.

Disposing the n-InGaAsP cladding layer 20 in this way produces the same effect as that of the semiconductor laser 10 described above.

Thus, in the semiconductor lasers of the present embodiment described above employing a p-InP substrate, an n-InGaAsP cladding layer having a layer thickness of between. 0.05 μm and 0.3 μm (for example, 100 nm) is inserted into an n-InP cladding layer. With this arrangement, the average value of the refractive indices of the cladding layers on the n side becomes larger than that for the cladding layers on the p side, shifting the weighted center of the optical intensity distribution toward the cladding layers on the n side. Accordingly, the light leakage is also shifted toward the n side, resulting in reduced light absorption on the p side.

Furthermore, since the leakage of light on the p side is reduced, it is not necessary to reduce the impurity concentration on the p side, resulting in no increase in the electrical resistance due to reduced impurity concentration.

Therefore, roll-off of the optical output due to heat generation does not occur, making it possible to reduce the absorption of light and thereby increase the optical output and the slope efficiency.

Furthermore, since inserting the n-InGaAsP cladding layer does not change the near-field pattern a great deal, it is possible to ensure optical matching of the semiconductor laser with optical fibers which is equivalent to that of conventional semiconductor lasers, providing good matching to the existing optical fiber networks. As a result, it is possible to provide a semiconductor laser for communications which has high optical output efficiency and good matching to optical fibers.

Second Embodiment

Figure 8:
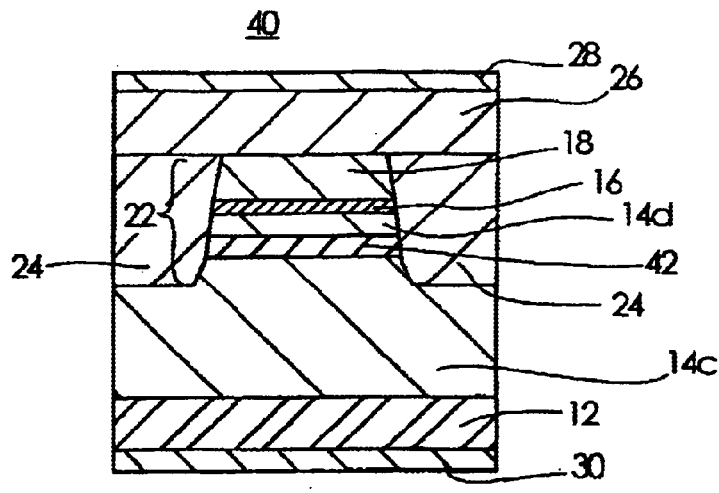
FIG. 8 is a cross-sectional view of a semiconductor laser according to an embodiment of the present invention.

FIG. 8 is a cross-sectional view of a semiconductor laser according to a second embodiment of the present invention.

In the figure, reference numeral 40 denotes a semiconductor laser. In FIG. 8, the optical waveguide direction of the semiconductor laser 40 is perpendicular to the paper. Reference numeral 42 denotes a p-AlGaInAs cladding layer used as the semiconductor layer.

Employing a p-InP substrate 12, the semiconductor laser 40 is configured much in the same way as the semiconductor laser 10 of the first embodiment. However, whereas the semiconductor laser 10 is configured such that the n-InGaAsP cladding layer 20 having a refractive index higher than that of the n-InP cladding layer 18 is inserted into the n-InP cladding layer 18, the semiconductor laser 40 is configured such that a p-AlGaInAs cladding layer having a refractive index lower than that of the p-InP cladding layer 14 is inserted into the p-InP cladding layer 14.

In the semiconductor laser 40, a p-AlGaInAs cladding layer 42 is inserted between p-InP cladding layers 14d and 14c.

Furthermore, the optical waveguide ridge 22 is composed of the n-InP cladding layer 18, the active region 16, the p-InP cladding layer 14d, the p-AlGaInAs cladding layer 42, and a portion of the p-InP cladding layer 14c.

The p-AlGaInAs cladding layer 42 is added with Zn as an impurity and has a layer thickness (L4) of 100 nm and a carrier concentration of $1 \times 10^{18}$ cm$^{-1}$.

Figure 9:
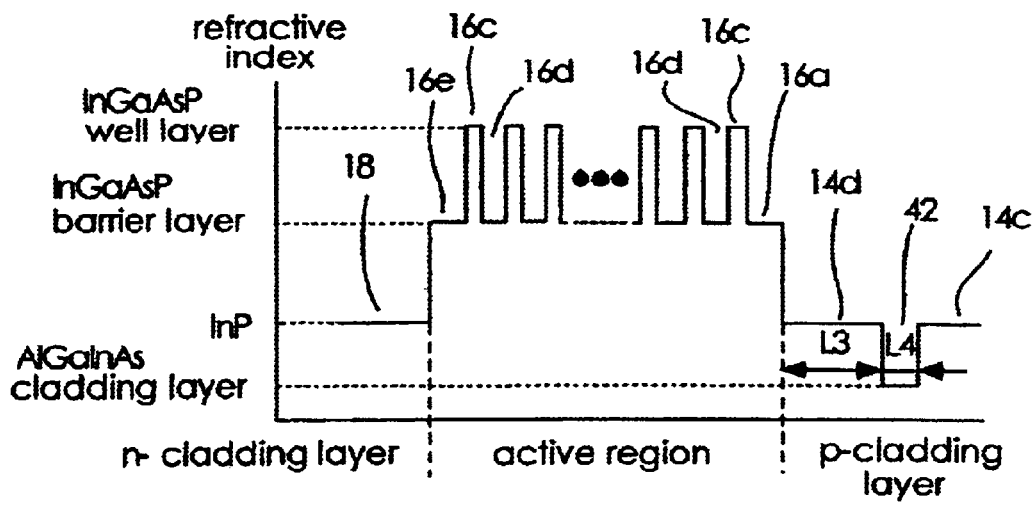
FIG. 9 is a schematic diagram showing refractive indices of the semiconductor laser according to an embodiment of the present invention.

FIG. 9 is a schematic diagram showing refractive indices of the semiconductor laser according to the second embodiment of the present invention.

In the figure, the refractive index of the p-AlGaInAs cladding layer 42 is smaller than that of the p-InP cladding layer 14. According to the present embodiment, the distance L3 between the light confining InGaAsP layer 16a and the p-AlGaInAs cladding layer 42 is equal to the layer thickness of the p-InP cladding layer 14d, for example, 700 nm.

It is necessary to set the position of the p-AlGaInAs cladding layer 42 closer to the active layer than the position at which the optical intensity of the near-field pattern of the laser light becomes substantially zero. Preferably, the p-AlGaInAs cladding layer 42 may be set at a position closer to the active layer than the position at which the optical intensity is reduced to 10% of the peak value.

According to the second embodiment, since the optical intensity of the near-field pattern becomes substantially zero at a distance of approximately between 1.5 μm (1,500 nm) and 2.0 μm from the active region 16, the sum of the distance L3 between the light confining InGaAsP layer 16a and the p-AlGaInAs cladding layer 0.42 and the layer thickness L4 of the p-AlGaInAs cladding layer 42 is set to 1.5 μm or less, preferably between 0.7 and 0.9 μm.

The method for manufacturing the semiconductor laser 40 is similar to the method for manufacturing the semiconductor laser 10 of the first embodiment described above. However, the method of the second embodiment is different from that of the first embodiment in that each layer is formed by use of the MOCVD method in an order different from that employed by the first embodiment, and the p-AlGaInAs cladding layer 42 is formed instead of the n-InGaAsP cladding layer 20.

In the semiconductor laser 40, the p-AlGaInAs cladding layer 42 having a refractive index smaller than that of the p-InP cladding layer 14 is inserted into the p-InP cladding layer 14. Therefore, the average value of the refractive indices of the cladding layers on the p side becomes smaller than that for the cladding layers on the n side, shifting the weighted center of the optical intensity distribution toward the cladding layers on the n side. Accordingly, the light leakage is also shifted toward the n side, resulting in reduced light absorption on the p side and enhanced slope efficiency, as in the case of the first embodiment.

Furthermore, since inserting the p-AlGaInAs cladding layer 42 does not change the near-field pattern a great deal, it is possible to ensure optical matching of the semiconductor laser with optical fibers which is equivalent to that of conventional semiconductor lasers. As a result, it is possible to provide a semiconductor laser for communications which has high optical output efficiency and good matching to optical fibers.

Figure 10:
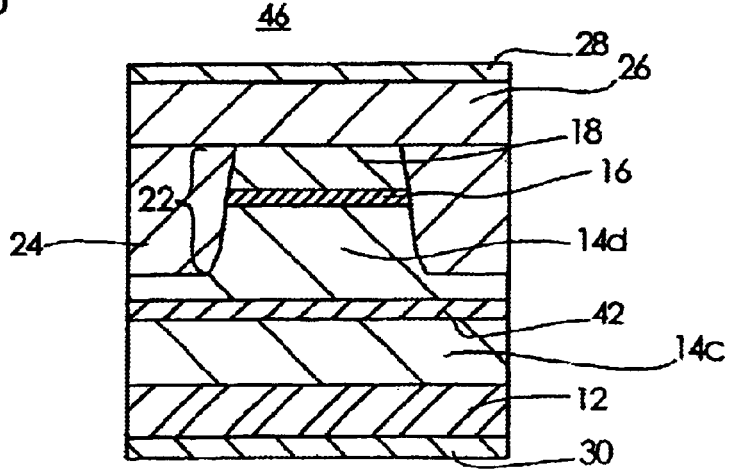
FIG. 10 is a cross-sectional view of a variation of the semiconductor laser according to an embodiment of the present invention.

FIG. 10 is a cross-sectional view of a variation of the semiconductor laser according to the second embodiment of the present invention.

In the figure, reference numeral 46 denotes a semiconductor laser. In the semiconductor laser 46, the optical waveguide ridge 22 is composed of the n-InP cladding layer 18, the active region 16, and a portion of the p-InP cladding layer 14d. The portion of the p-InP cladding layer 14d constituting the optical waveguide ridge 22 is relatively thin. In such a case, the p-AlGaInAs cladding layer 42 may not be inserted inside the optical waveguide ridge 22. Instead, it may be inserted between the p-InP cladding layers 14d and 14c formed in the lower portion of the optical waveguide ridge 22.

Also in this case, it is necessary to set the position of the n-AlGaInAs cladding layer 42 closer to the active layer than the position at which the optical intensity of the near-field pattern of the laser light becomes substantially zero. Preferably, the n-AlGaInAs cladding layer 42 may be set at a position closer to the active layer than the position at which the optical intensity is reduced to 10% of the peak value.

According to this variation of the second embodiment, since the optical intensity of the near-field pattern becomes substantially zero at a distance of approximately between 1.5 μm (1,500 nm) and 2.0 μm from the active region 16, the sum of the distance L3 between the active region 16 and the p-AlGaInAs cladding layer 42 and the layer thickness L4 of the p-AlGaInAs cladding layer 42 is set to 1.5 μm or less, preferably between 0.7 and 0.9 μm.

Thus, disposing the p-AlGaInAs cladding layer 42 between the optical waveguide ridge 22 and the p-InP substrate 12 also produces the same effect as that of the semiconductor laser 40 described above.

Thus, in the semiconductor lasers of the present embodiment described above employing a p-InP substrate, a p-AlGaInAs cladding layer having a refractive index lower than that of a p-InP cladding layer is inserted into the p-InP cladding layer. With this arrangement, the average value of the refractive indices of the cladding layers on the p side becomes smaller than that for the cladding layers on the n side, shifting the weighted center of the optical intensity distribution toward the cladding layers on the n side. Accordingly, the light leakage is also shifted toward the n side, resulting in reduced light absorption on the p side and enhanced slope efficiency.

Furthermore, it is possible to ensure optical matching of the semiconductor laser with optical fibers which is equivalent to that of conventional semiconductor lasers.

As a result, it is possible to provide a semiconductor laser for communications which has high optical output efficiency and good matching to optical fibers.

It should be noted that the first embodiment employs the p-InP substrate 12 and disposes the n-InGaAsP cladding layer 20 on the n side of the active region 16, while the second embodiment employs the p-InP substrate 12 and disposes the p-AlGaInAs cladding layer 42 on the p side of the active region 16. However, the present invention may be configured such that the p-InP substrate 12 is employed as in the above embodiments and an n-InGaAsP cladding layer and a p-AlGaInAs cladding layer are disposed on the n side and on the p side of the active region 16, respectively.

Third Embodiment

Figure 11:
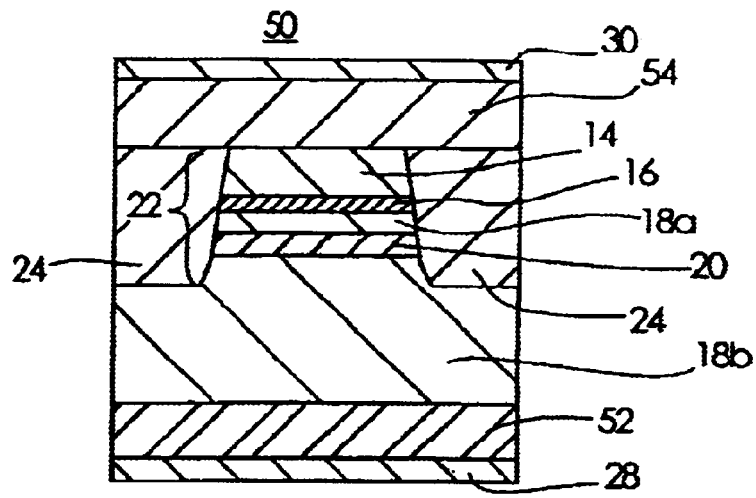
FIG. 11 is a cross-sectional view of a semiconductor laser according to an embodiment of the present invention.

FIG. 11 is a cross-sectional view of a semiconductor laser according to a third embodiment of the present invention.

In the figure, reference numeral 50 denotes a semiconductor laser. In FIG. 11, the optical waveguide direction of the semiconductor laser 50 is perpendicular to the paper.

Reference numeral 52 denotes an n-InP substrate used as the semiconductor substrate. The n-InP substrate 52 has disposed thereon the n-InP cladding layer 18b which in turn has the n-InGaAsP cladding layer 20 disposed thereon. Furthermore, the n-InP cladding layer 18a is disposed on the n-InGaAsP cladding layer 20. The n-InP cladding layers 18a and 18b collectively constitute the n-InP cladding layer 18, which is a first cladding layer.

In addition, the active region 16 is disposed on the n-InP cladding layer 18a, and the p-InP cladding layer 14, which is a second cladding layer, is disposed on the active layer 16.

The p-InP cladding layer 14, the active region 16, the n-InP cladding layer 18a, the n-InGaAsP cladding layer 20, and a portion of the n-InP cladding layer 18b are formed in a ridge shape, collectively forming the optical waveguide ridge 22.

The InP layer 24 is disposed on each side of the optical waveguide ridge 22, and functions as a current blocking layer.

Reference numeral 54 denotes a p-InP contact layer disposed on the optical waveguide ridge 22 and the InP layer 24. The p type electrode 30 is disposed on the p-InP contact layer 54, while the n type electrode 28 is disposed on the rear surface of the n-InP substrate 52.

Even though the semiconductor laser 50 employs a semiconductor substrate and a layer configuration different from those of the semiconductor laser 10, it is manufactured by use of a method similar to that for the first embodiment.

Also in the third embodiment, the distance L2 between the active region 16 and the n-InGaAsP cladding layer 20 is equal to the layer thickness L2 of the n-InP cladding layer 18a, for example, 700 nm. The layer thickness L1 of the n-InGaAsP cladding layer 20 is 100 nm.

Further, it is necessary to set the position of the n-InGaAsP cladding layer 20 closer to the active layer than the position at which the optical intensity of the near-field pattern of the laser light becomes substantially zero. Preferably, the n-InGaAsP cladding layer 20 may be set at a position closer to the active layer than the position at which the optical intensity is reduced to 10% of the peak value.

According to the third embodiment, since the optical intensity of the near-field pattern becomes substantially zero at a distance of approximately between 1.5 $\mu$m (1,500 nm) and 2.0 $\mu$m from the active region 16, the sum of L1 and L2 is set to 1.5 $\mu$m or less, preferably between 0.7 and 0.9 $\mu$m.

On the other hand, the layer thickness L1 of the n-InGaAsP cladding layer 20 is set to between 0.05 $\mu$m and 0.3 $\mu$m, preferably between 0.05 $\mu$m and 0.2 $\mu$m (more preferably to around 0.1 $\mu$m).

In the semiconductor laser 50, the n-InGaAsP cladding layer 20 having a refractive index larger than that of InP and smaller than that of the well layer 16c is inserted into the n-InP cladding layer 18. Therefore, the average value of the refractive indices of the cladding layers on the n side also becomes larger than that for the cladding layers on the p side, shifting the weighted center of the optical intensity distribution toward the cladding layers on the n side, as is the case with the first embodiment. Accordingly, the light leakage is also shifted toward the n side, resulting in reduced light absorption on the p side.

Furthermore, since light absorption on the p side is reduced, it is not necessary to reduce the impurity concentration on the p side, resulting in no increase in the electrical resistance due to reduced impurity concentration. Therefore, roll-off of the optical output due to heat generation does not occur, making it possible to reduce the absorption of light and thereby enhance the slope efficiency.

Furthermore, since inserting the n-InGaAsP cladding layer does not change the near-field pattern a great deal, it is possible to ensure optical matching of the semiconductor laser with optical fibers which is equivalent to that of conventional semiconductor lasers, providing good matching to the existing optical fiber networks. As a result, it is possible to provide a semiconductor laser for communications which has high optical output efficiency and good matching to optical fibers.

Figure 12:
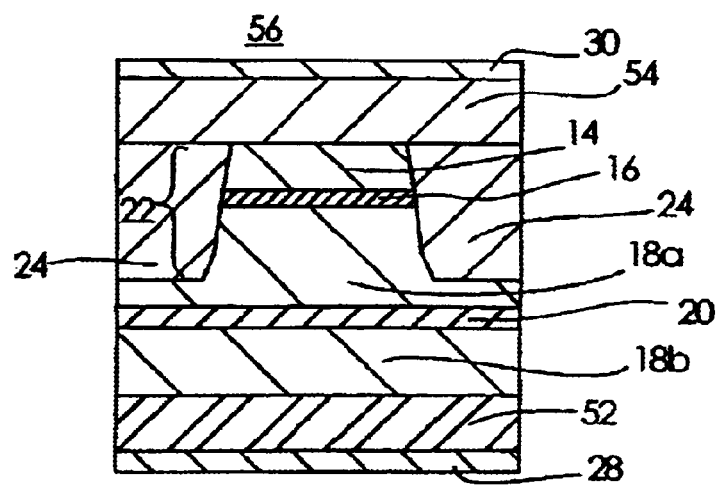
FIG. 12 is a cross-sectional view of a variation of the semiconductor laser according to an embodiment of the present invention.

FIG. 12 is a cross-sectional view of a variation of the semiconductor laser according to the third embodiment of the present invention.

In the figure, reference numeral 56 denotes a semiconductor laser. In the semiconductor laser 56, the optical waveguide ridge 22 is composed of the p-InP cladding layer 14, the active region 16, and a portion of the n-InP cladding layer 18a. The portion of the n-InP cladding layer 18a constituting the optical waveguide ridge 22 is relatively thin. In such a case, the n-InGaAsP cladding layer 20 may not be inserted inside the optical waveguide ridge 22. Instead, it may be inserted between the n-InP cladding layer 18a and the n-InP cladding layer 18b formed in the lower portion of the optical waveguide ridge 22.

Also in this case, it is necessary to set the position of the n-InGaAsP cladding layer 20 closer to the active layer than the position at which the optical intensity of the near-field pattern of the laser light becomes substantially zero. Preferably, the n-InGaAsP cladding layer 20 may be set at a position closer to the active layer than the position at which the optical intensity is reduced to 10% of the peak value. According to this variation, since the optical intensity of the near-field pattern becomes substantially zero at a distance of approximately between 1.5 $\mu$m (1.500 nm) and 2.0 $\mu$m from the active region 16, the sum of L1 and L2 is set to 1.5 $\mu$m or less, preferably between 0.7 and 0.9 $\mu$m.

Disposing the n-InGaAsP cladding layer 20 in this way produces the same effect as that of the semiconductor laser 50.

Thus, in the semiconductor lasers of the present embodiment described above employing an n-InP substrate, an n-InGaAsP cladding layer having a layer thickness of between 0.05 $\mu$m and 0.3 $\mu$m (for example, approximately 100 nm) is inserted between the n-InP cladding layers. With this arrangement, the average value of the refractive indices of the cladding layers on the p side becomes larger than that for the cladding layers on the n side, shifting the weighted center of the optical intensity distribution toward the cladding layers on the n side. Accordingly, the light leakage is also shifted toward the n side, resulting in reduced light absorption on the p side and enhanced slope efficiency.

Furthermore, it is possible to ensure optical matching of the semiconductor laser with optical fibers which is equivalent to that of conventional semiconductor lasers.

As a result, it is possible to provide a semiconductor laser for communications which has high optical output efficiency and good matching to optical fibers.

Fourth Embodiment

Figure 13:
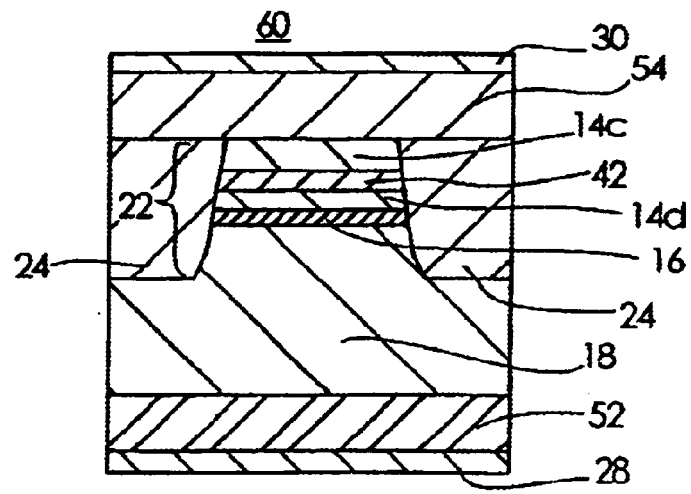
FIG. 13 is a cross-sectional view of a semiconductor laser according to an embodiment of the present invention.

FIG. 13 is a cross-sectional view of a semiconductor laser according to a fourth embodiment of the present invention.

In the figure, reference numeral 60 denotes a semiconductor laser. In FIG. 13, the optical waveguide direction of the semiconductor laser 60 is perpendicular to the paper.

Employing the n-InP substrate 52, the semiconductor laser 60 is configured much in the same way as the semiconductor laser 50 of the third embodiment. However, whereas the semiconductor laser 50 is configured such that the n-InGaAsP cladding layer 20 having a refractive index higher than that of the n-InP cladding layer 18 is inserted into the n-InP cladding layer 18, the semiconductor laser 60 is configured such that the p-AlGaInAs cladding layer 42 having a refractive index lower than that of the p-InP cladding layer 14 is inserted into the p-InP cladding layer 14.

That is, the n-InP cladding layer 18 is disposed on the n-InP substrate 52, and the active region 16 is disposed on the n-InP cladding layer 18. The p-AlGaInAs cladding layer 42 is inserted between the p-InP cladding layer 14*d*, which is adjacently disposed on the active region 16, and the p-InP cladding layer 14*c* disposed on the p-InP cladding layer 14*d*.

Furthermore, the optical waveguide ridge 22 is composed of a portion of the n-InP cladding layer 18, the active region 16, the p-InP cladding layer 14*d*, the p-AlGaInAs cladding layer 42, and the p-InP cladding layer 14*c*.

It is necessary to set the position of the p-AlGaInAs cladding layer 42 closer to the active layer than the position at which the optical intensity of the near-field pattern of the laser light becomes substantially zero. Preferably, the p-AlGaInAs cladding layer 42 may be set at a position closer to the active layer than the position at which the optical intensity is reduced to 10% of the peak value.

According to the fourth embodiment, since the optical intensity of the near-field pattern becomes substantially zero at a distance of approximately between 1.5 $\mu$m (1,500 nm) and 2.0 $\mu$m from the active region 16, the sum of the distance L3 between the light confining InGaAsP layer 16*a* and the p-AlGaInAs cladding layer 42 and the layer thickness L4 of the p-AlGaInAs cladding layer 42 is set to 1.5 $\mu$m or less, preferably between 0.7 and 0.9 $\mu$m.

In the semiconductor laser 60, the p-AlGaInAs cladding layer 42 having a refractive index smaller than that of the p-InP cladding layer 14 is inserted into the p-InP cladding layer 14. Therefore, the average value of the refractive indices of the cladding layers on the p side becomes smaller than that for the cladding layers on the n side, shifting the weighted center of the optical intensity distribution toward the cladding layers on the n side. Accordingly, the light leakage is also shifted toward the n side, resulting in reduced light absorption: on the p side, increased optical output, and enhanced slope efficiency.

Furthermore, since inserting the p-AlGaInAs cladding layer 42 does not change the near-field pattern a great deal, it is possible to ensure optical matching of the semiconductor laser with optical fibers which is equivalent to that of conventional semiconductor lasers. As a result, it is possible to provide a semiconductor laser for communications which has high optical output efficiency and good matching to optical fibers.

Figure 14:
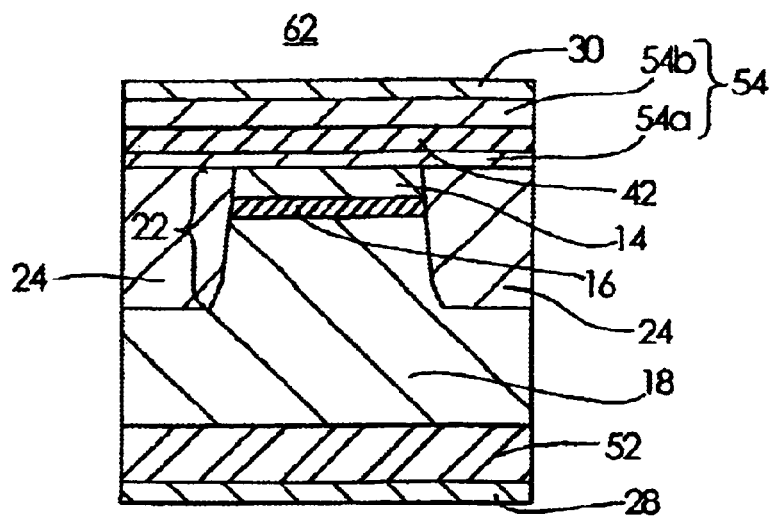
FIG. 14 is a cross-sectional view of a variation of the semiconductor laser according to an embodiment of the present invention.
Figure 15:
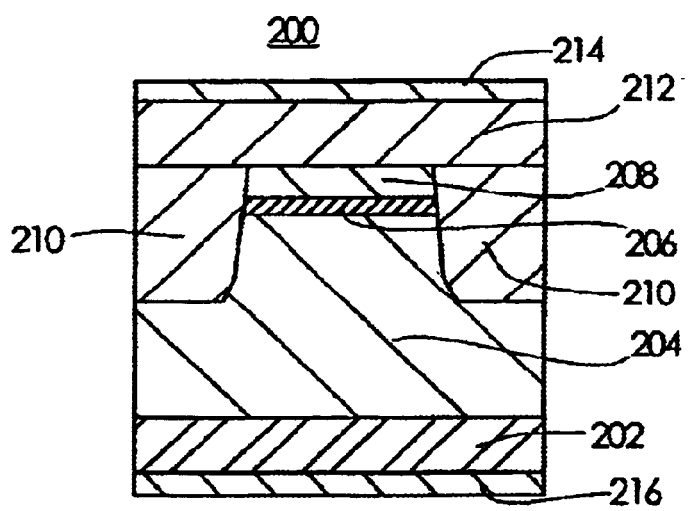
FIG. 15 is a cross-sectional view of a conventional semiconductor laser.

FIG. 14 is a cross-sectional view of a variation of the semiconductor laser according to the fourth embodiment of the present invention.

In the figure, reference numeral 62 denotes a semiconductor laser.

In the semiconductor laser 62, the p-InP cladding layer 14 is relatively thin. In this case, the p-InP contact layer 54 is divided into two layers: a p-InP contact layer 54*a* and a p-InP contact layer 54*b*. Then, the p-AlGaInAs cladding layer 42 is disposed between them.

Also in this case, it is necessary to set the position of the p-AlGaInAs cladding layer 42 closer to the active layer than the position at which the optical intensity of the near-field pattern of the laser light becomes substantially zero. Preferably, the p-AlGaInAs cladding layer 42 may be set at a position closer to the active layer than the position at which the optical intensity is reduced to 10% of the peak value.

According to this variation, since the optical intensity of the near-field pattern becomes substantially zero at a distance of approximately between 1.5 $\mu$m (1,500 nm) and 2.0 $\mu$m from the active region 16, the sum of the distance L3 between the light confining InGaAsP layer 16*a* and the p-AlGaInAs cladding layer 42 and the layer thickness L4 of the p-AlGaInAs cladding layer 42 is set to 1.5 $\mu$m or less, preferably between 0.7 and 0.9 $\mu$m.

Thus, the semiconductor laser 62 in which the p-AlGaInAs cladding layer 42 is disposed as described above produces the same effect as that of the semiconductor laser 60.

In the semiconductor lasers of the present embodiment described above employing an n-InP substrate, a p-AlGaInAs cladding layer having a refractive index lower than that of a p-InP cladding layer is inserted into the p-InP cladding layer. With this arrangement, the average value of the refractive indices of the cladding layers on the p side becomes smaller than that for the cladding layers on the n side, shifting the weighted center of the optical intensity distribution toward the cladding layers on the n side. Accordingly, the light leakage is also shifted toward the n side, resulting in reduced light absorption on the p side and enhanced slope efficiency.

Furthermore, it is possible to ensure optical matching of the semiconductor laser with optical fibers which is equivalent to that of conventional semiconductor lasers.

As a result, it is possible to provide a semiconductor laser for communications which has high optical output efficiency and good matching to optical fibers.

It should be noted that the third embodiment employs the n-InP substrate 52 and disposes the n-InGaAsP cladding layer 20 on the n side of the active region 16, while the fourth embodiment employs the n-InP substrate 52 and inserts the p-AlGaInAs cladding layer 42 on the p side of the active region 16. However, the present invention may be configured such that the n-InP substrate 52 is employed as in the above embodiments and an n-InGaAsP cladding layer and a p-AlGaInAs cladding layer are inserted on the n side and on the p side of the active region 16, respectively.

The first to fourth embodiments described above relate to semiconductor lasers which include an active layer having a multiple quantum well structure. However, the present invention can be applied to semiconductor lasers which include an active layer having a single quantum well structure, or semiconductor lasers having a double heterostructure and including an active layer which does not have a quantum well structure, with the same effect.

Configured as described above, the semiconductor laser devices according to the present invention have the following effects.

A semiconductor laser device of the present invention comprises: a semiconductor substrate of a first conductive type; a first cladding layer of a first conductive type disposed on the semiconductor substrate; an active layer disposed on the first cladding layer; a second cladding layer of a second conductive type disposed on the active layer; a semiconductor layer with a thickness of between 0.05 $\mu$m and 0.3 $\mu$m laminated at a position closer to the active layer than a position at which an optical intensity of a near-field pattern of laser light emitted from the active layer becomes substantially zero, the semiconductor layer shifting a weighted center of an optical intensity distribution toward an n (second conductive type) side. Therefore, light leakage is shifted toward a cladding layer side of the n-conductive type without changing the near-field pattern a great deal, which leads to reduced light absorption in the cladding layer of the p-conductive type, increased optical output, and enhanced slope efficiency. As a result, it is possible to provide a semiconductor laser which has high optical output efficiency and exhibits only a small reduction in the optical output even when a large current flows and whose matching to optical fibers is not much different than that of conventional semiconductor lasers.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A semiconductor laser device comprising:
    a p-type semiconductor substrate of a first conductivity type;
    a p-type first cladding layer, disposed on said semiconductor substrate;
    an active layer disposed on said first cladding layer;
    an n-type second cladding layer, disposed on said active layer; and
    an n-type semiconductor layer with a thickness between 0.05 $\mu$m and 0.3 $\mu$m, laminated at a position closer to said active layer than a position at which optical intensity of a near-field pattern of laser light emitted from said active layer becomes substantially zero, said semiconductor layer having a refractive index larger than that of said second cladding layer and smaller than that of said active layer and shifting a weighted center of optical intensity distribution of light emitted from said semiconductor laser toward an n conductivity type side of said semiconductor laser.

2. The semiconductor laser device according to claim 1, wherein said active layer has a quantum well structure and including a first light confining layer and a second light confining layer supported by said semiconductor substrate, in that order, with said active layer between said first light confining layer and said second light confining layer.

3. The semiconductor laser device according to claim 1, wherein said semiconductor layer is laminated in a region on the n conductivity type side of said semiconductor laser and at a distance no more than 1.5 $\mu$m from an interface surface of said active layer, the interface surface being on the n conductivity type side of said semiconductor laser.

4. A semiconductor laser device comprising:
    a p-type semiconductor substrate of a first conductivity type;
    a p-type first cladding layer, disposed on said semiconductor substrate;
    an active layer disposed on said first cladding layer;
    an n-type second cladding layer, disposed on said active layer; and
    a p-type semiconductor layer with a thickness between 0.05 $\mu$m and 0.3 $\mu$m, laminated at a position closer to said active layer than a position at which optical intensity of a near-field pattern of laser light emitted from said active layer becomes substantially zero, said semiconductor layer having a refractive index smaller than that of said first cladding layer and shifting a weighted center of optical intensity distribution of light emitted from said semiconductor laser toward an n conductivity type side of said semiconductor laser.

5. The semiconductor laser device according to claim 4, wherein said active layer has a quantum well structure and including a first light confining layer and a second light confining layer supported by said semiconductor substrate, in that order, with said active layer between said first light confining layer and said second light confining layer.

6. The semiconductor laser device according to claim 4, wherein said semiconductor layer is laminated in a region on a p conductivity type side of said semiconductor laser and at a distance no more than 1.5 $\mu$m from an interface surface of said active layer, the interface surface being on the p conductivity type side of said semiconductor laser.

7. A semiconductor laser device comprising:
    an n-type semiconductor substrate of a first conductivity type;
    an n-type first cladding layer, disposed on said semiconductor substrate;
    an active layer disposed on said first cladding layer;
    a p-type second cladding layer, disposed on said active layer; and
    a p-type semiconductor layer with a thickness between 0.05 $\mu$m and 0.3 $\mu$m, laminated at a position closer to said active layer than a position at which optical intensity of a near-field pattern of laser light emitted from said active layer becomes substantially zero, said semiconductor layer having a refractive index smaller than that of said second cladding layer and shifting a weighted center of optical intensity distribution of light emitted from said semiconducter laser toward an n conductivity type side of said semiconductor laser.

8. The semiconductor laser device according to claim 7, wherein said active layer has a quantum well structure and including a first light confining layer and a second light confining layer supported by said semiconductor substrate, in that order, with said active layer between said first light confining layer and said second light confining layer.

9. The semiconductor laser device according to claim 7, wherein said semiconductor layer is laminated in a region on a p conductivity type side of said semiconductor laser and at a distance no more than 1.5 $\mu$m from an interface surface of said active layer, the interface surface being on the p conductivity type side of said semiconductor laser.

* * * * *